United States Patent
Hedrick et al.

(10) Patent No.: US 6,783,862 B2
(45) Date of Patent: Aug. 31, 2004

(54) TOUGHNESS, ADHESION AND SMOOTH METAL LINES OF POROUS LOW K DIELECTRIC INTERCONNECT STRUCTURES

(75) Inventors: Jeffrey C Hedrick, Montvalle, NJ (US); Kang-Wook Lee, Yorktown Heights, NY (US); Kelly Malone, Poughkeepsie, NY (US); Christy S Tyberg, Mahopac, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/290,682

(22) Filed: Nov. 8, 2002

(65) Prior Publication Data

US 2003/0114013 A1 Jun. 19, 2003

Related U.S. Application Data

(60) Provisional application No. 60/339,734, filed on Dec. 13, 2001.

(51) Int. Cl.$^7$ ................................................. B32B 9/04
(52) U.S. Cl. ........................ 428/447; 428/446; 428/448; 257/756; 257/775; 438/623; 438/634; 438/6
(58) Field of Search ............................. 428/446, 447, 428/448; 438/623, 6, 634; 257/756, 775

(56) References Cited

U.S. PATENT DOCUMENTS 5,789,819 A * 8/1998 Gnade et al. ............... 257/759
6,017,809 A   6/2000 Zhao ........................... 438/634
6,150,031 A * 11/2000 Yonehara ..................... 428/446
6,177,199 B1  1/2001 Hacker et al. ............... 428/447
6,218,020 B1  4/2001 Hacker et al. ............... 428/447
6,358,842 B1 * 3/2002 Zhou et al. .................. 438/633
6,383,920 B1  5/2002 Wang et al. ................. 438/639
6,472,306 B1  10/2002 Lee et al. .................... 438/623
6,593,211 B2 * 7/2003 Sato ........................... 438/455
6,603,204 B2 * 8/2003 Gates et al. ................. 257/760

FOREIGN PATENT DOCUMENTS

WO    WO 00/31183    6/2000
WO    WO 00/40637    7/2000

* cited by examiner

*Primary Examiner*—Margaret G. Moore
(74) *Attorney, Agent, or Firm*—Ohlandt, Greeley, Ruggiero & Perle, L.L.P.; Daniel P. Morris

(57) ABSTRACT

A structure useful for electrical interconnection comprises a substrate; a plurality of porous dielectric layers disposed on the substrate; an etch stop layer disposed between a first of the dielectric layers and a second of the dielectric layers; and at least one thin, tough, non-porous dielectric layer disposed between at least one of the porous dielectric layers and the etch stop layer. A method for forming the structure comprising forming a multilayer stack of porous dielectric layers on the substrate, the stack including the plurality of porous dielectric layers, and forming a plurality of patterned metal conductors within the multilayer stack. Curing of the multilayer dielectric stack may be in a single cure step in a furnace. The application and hot plate baking of the individual layers of the multi layer dielectric stack may be accomplished in a single spin-coat tool, without being removed, to fully cure the stack until all dielectric layers have been deposited.

51 Claims, 1 Drawing Sheet

TOUGHNESS, ADHESION AND SMOOTH METAL LINES OF POROUS LOW K DIELECTRIC INTERCONNECT STRUCTURES

CROSS REFERENCE TO RELATED APPLICATION

This application claims priority, under 35 U.S.C. 119(e), from provisional patent application serial No. 60/339,734 filed on Dec. 13, 2001.

This application is related to application serial number 10/290,616 (currently allowed), entitled Porous Low-k Dielectric Interconnects with Improved Adhesion Produced by Partial Burnout of Surface Porogens, assigned to the same assignee as the present application, and filed of even date herewith.

BACKGROUND OF THE INVENTION

1. Field of the Invention

This invention relates to interconnect structures for high-speed microprocessors, application specific integrated circuits (ASICs), and other high speed IC's. The invention provides ultra low dielectric constant (low-k) interconnect structures having enhanced circuit speed, precise values of conductor resistance, and improved mechanical integrity. The structures of this invention have improved toughness and adhesion along with improved control over the metal line resistance compared to conventional structures. The present invention also provides many additional advantages which shall become apparent as described below.

2. Background Art

This application is related to application Ser. No. 09/795,431, entitled Low-k Dielectric Interconnect Structure Comprised of a Multi Layer of Spin-On Porous Dielectrics, assigned to the same assignee as the present application, and filed on Feb. 28, 2001, the contents of which are incorporated herein by reference.

Many low-k dielectric plus copper interconnect structures of the dual damascene type are known. For example, reference is made to U.S. Pat. No. 6,383,920, which is assigned to the same assignee as the present invention, and is incorporated in its entirety by reference, as if fully set forth herein. However, in order to achieve the necessary reduction in the RC delay in the future generations, porous materials must be used as the dielectric. In addition, due to the 5–20 nanometer pore sizes of porous organic materials, a buried etch stop layer is necessary to give smooth metal line bottoms. These structures undergo several processing steps including chemical mechanical polishing (CMP) of the copper, which create stresses within the dielectric stack that can lead to delamination. Delamination can occur due to poor adhesion at the etch stop to dielectric interfaces, or within the dielectric due to decreased toughness of the porous dielectric and increased stress near the interfaces.

SUMMARY OF THE INVENTION

It is an object of this invention to provide an ultra low-k dielectric plus copper interconnect structure of the dual damascene type with precise and uniform control over the copper conductor resistance with increased toughness and adhesion to prevent delaminations during CMP.

It is an object of this invention to provide a porous dielectric stack with a buried RIE stop with improved toughness and adhesion that is based on a multilayer of spin coated dielectrics.

It is an object of this invention to provide a low-k dielectric plus copper interconnect structure with precise and uniform control over the copper conductor resistance that is based on a multilayer of spin coated dielectric layers, with improved toughness and adhesion and decreased line roughness.

It is another object of this invention to provide a method for making the inventive structure.

The structures of this invention are unique in that they have an ultra-thin non-porous tough dielectric layer between the porous dielectric and the buried etch stop layer. This tough, thin non-porous dielectric layer serves several purposes: it improves toughness, adhesion and reliability of the interconnect structure. To improve adhesion, the non-porous layer is a version of the porous dielectric with a fracture toughness of greater than 0.3 MPa-m$^{1/2}$ which will covalently bond with the porous dielectric to create one network, while increasing the surface area of contact with the etch stop layer by eliminating pores at the surface. Increased toughness is achieved by incorporating a tough material near the interface in the area of increased stress in the structure. This type of tough material does not have the necessary properties to support the very small pores required by the porous dielectric and therefore generally cannot be used as the matrix for the porous dielectric. Finally, by incorporating a non-porous dielectric layer between the etch stop layer and the porous dielectric layer, smoother lines can be achieved by eliminating pores at the bottom of the etch stop.

Thus, the present invention is directed to a metal wiring plus porous low dielectric constant (low-k) interconnect structure having improved toughness and adhesion, of the dual damascene type with a spin-on buried RIE stop. The inventive structure is comprised of: a) a multilayer of all spin-on dielectric materials which are applied sequentially in a single tool, and then cured in a single furnace cure step, and b) a plurality of patterned metal conductors within the dielectric multilayer. The improved toughness and adhesion is obtained by incorporating a thin, non-porous dielectric layer, which has a fracture toughness greater than 0.3 MPa-m$^{1/2}$, between the porous dielectric and the etch stop, between the etch stop and the porous dielectric, or both.

In accordance with the invention, a structure, and in particular an electrical interconnect structure, comprises a substrate; a plurality of porous dielectric layers disposed on the substrate; an etch stop layer disposed between a first of the dielectric layers and a second of the dielectric layers; and at least one thin, non-porous dielectric layer disposed between at least one of the porous dielectric layers and the etch stop layer. The thin, non-porous dielectric layer may have a thickness of substantially 25 to 150 Angstroms. Preferably, the thin, non-porous dielectric layer has a composition with reactive functionalities identical to those of the porous dielectric layers and in particular a composition which forms a covalent bond with the composition of the porous dielectric layers. The thin, non-porous dielectric layer may be comprised of a material selected from the group consisting of SiLK™, GX-3™, or other low k dielectric materials that exhibit fracture toughness values greater than 0.3 MPa-m$^{1/2}$, preferably greater than 0.35 MPa-m$^{1/2}$, and will covalently bond to the porous dielectric layer. Materials of this kind are described in Patent Cooperation Treaty International Patent Application WO 00/40637 entitled Low Dielectric Constant Polymers Having Good Adhesion and Toughness and Articles Made With Such Polymers of Edward O. Shaffer II et al. which is assigned to The Dow Chemical Company.

At least one of the porous dielectric layers is comprised of a material selected from the group consisting of porous SiLK™, GX-3p™, or other porous low-k dielectric layers. Materials of this kind are described in Patent Cooperation Treaty International Patent Application WO 00/31183 entitled A composition containing a cross-linkable matrix precursor and a porogen, and a porous matrix prepared therefrom of Kenneth, J. Bruza et al. which is assigned to The Dow Chemical Company, the contents of which are incorporated herein in their entirety by reference. It may have a thickness of substantially 600–5000 Angstroms. In general, at least one of the porous dielectric layers has the same chemical composition as another of the porous dielectric layers. At least one of the porous dielectric layers may be of substantially the same thickness as another of the porous dielectric layers and have a thickness of substantially 600–5000 Angstroms.

The etch stop layer may be comprised of HOSP™, HOSP BESt™, Ensemble™ Etch Stop, Ensemble™ Hard Mask, organo silsesquioxanes, hydrido silsesquioxanes, hydrido-organo silsesquioxanes, siloxanes, or other spin-on material with etch selectivity to the porous dielectric. Materials of this kind are described in U.S. Pat. No. 6,218,020 entitled Dielectric films from organohydridosiloxane resins with high organic content of Nigel P. Hacker et al. which is assigned to AlliedSignal Inc., and U.S. Pat. No. 6,177,199 entitled Dielectric films from organohydridosiloxane resins with low organic content of Nigel P. Hacker et al. which is assigned to AlliedSignal Inc., the contents of which are incorporated herein in their entirety by reference. It may have a thickness of substantially 200–600 Angstroms.

The structure may further comprise a plurality of patterned metal conductors formed within a multilayer stack of porous dielectric layers on the substrate, the stack including the plurality of porous dielectric layers. At least one of the patterned metal conductors may be an electrical via or a line connected to the via.

The invention is also directed to a method for forming an electrical interconnect structure on a substrate, the structure having a plurality of porous dielectric layers disposed on the substrate and an etch stop layer between a first of the dielectric layers and a second of the dielectric layers. The method comprises forming at least one thin, non-porous dielectric layer between at least one of the porous dielectric layers and the etch stop layer. The method further comprising forming a multilayer stack of porous dielectric layers on the substrate, the stack including the plurality of porous dielectric layers, and forming a plurality of patterned metal conductors within the multilayer stack. At least one of the patterned metal conductors may be formed as an electrical via. At least one of the patterned metal conductors may be a line connected to the via.

The multilayer dielectric stack is applied to the substrate by spin coating. The method may further comprise baking the individual layers of the multilayer dielectric stack on a hot plate. The method may further comprise curing the multilayer dielectric stack. The curing of the multiplayer dielectric stack may be accomplished using a furnace in a single step.

The method also includes applying a miltilayer dielectric stack to the substrate and baking the multilayer dielectric stack, so that the applying and baking are accomplished in a single spin-coat tool. Additional dielectric layers may be added, and dual damascene conductors may be formed in the additional layers.

Other and further objects, advantages and features of the present invention will be understood by reference to the following specification in conjunction with the annexed drawings, wherein like parts have been given like numbers.

DESCRIPTION OF THE PREFERRED EMBODIMENTS

Figure 1:
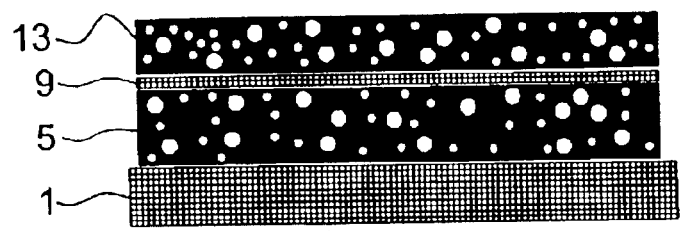
FIG. 1 is a schematic drawing of a porous dielectric with a buried etch stop in accordance with the prior art, before RIE and metallization.

Referring to FIG. 1, a structure on which, for example, an integrated circuit may be fabricated includes a substrate 1, a first porous dielectric layer 5, and a second porous dielectric layer 13. As is well known in the art, an etch stop layer 9 may be disposed between dielectric layers 5 and 13. Substrate 1 is generally comprised of silicon, and may include a dielectric, a metal region, an adhesion promoter, or any combination thereof. Substrate 1 may be a semiconductor wafer of a different composition, porous dielectic layers 5 and 13 may be comprised of a material sold under the trademark porous SiLK(™) (a Dow Chemical Company proprietary organic ultra low-k interlayer dielectric resin). Other possible materials include GX-3p™, or other porous low k dielectric materials.

Figure 2A:
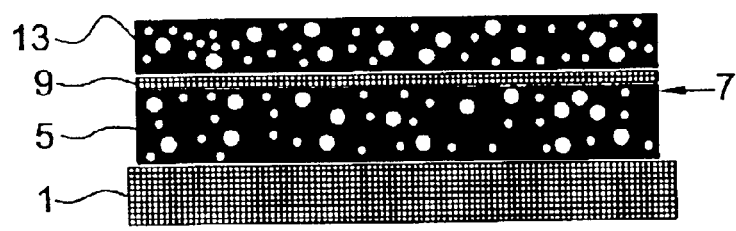
FIG. 2A is a schematic drawing of a structure in accordance with the invention with a thin layer below the etch stop before RIE and metallization.

Referring to FIG. 2A, in accordance with the invention, a non-porous dielectric layer with a fracture toughness greater than 0.3 MPa-m$^{1/2}$ 7 is provided between porous dielectric layer 5 and etch stop layer 9. Dielectric layer 7 may have a thickness of approximately 25–150 Angstroms. Dielectric layer 7 has increased fracture toughness compared to porous SiLK™ due to a decreased network density, as described in above mentioned International Patent Application WO 00/40637. This structure has the same reactive functionalities as a porous SiLK™ layer and can crosslink with a porous SiLK™ layer. Layer 7 preferably has a highly aromatic structure, which is thermally stable to approximately 425° C. with a glass transition temperature above 430° C., and a low dielectric constant of approximately 2.65.

Figure 2B:
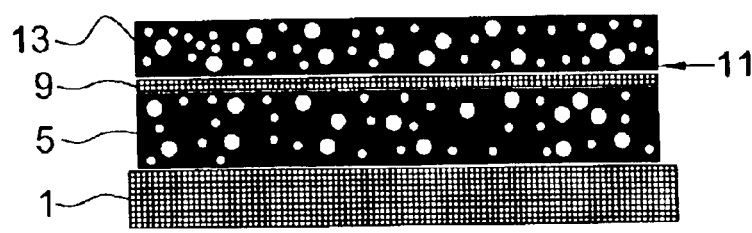
FIG. 2B is a schematic drawing of a structure in accordance with the invention with a thin layer above the etch stop before RIE and metallization.

The structure of FIG. 2B is similar to that of FIG. 2A, but does not include layer 7. Instead, the structure of FIG. 2B includes a layer 11 disposed between etch stop layer 9 and porous dielectric layer 13. Layer 11 may be, in all respects except location, similar to layer 7.

Figure 2C:
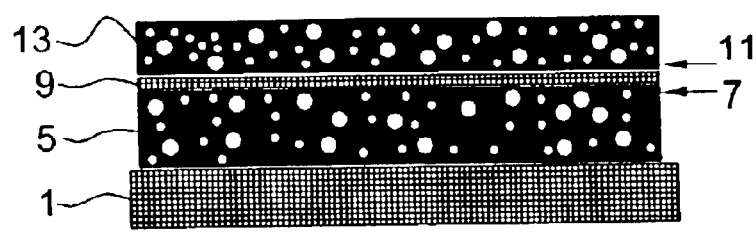
FIG. 2C is a schematic drawing of a structure in accordance with the invention with a thin layer both above and below the etch stop before RIE and metallization.

Referring to FIG. 2C, the structure shown therein includes both a layer 7 and a layer 11, having the characteristics described above. A more specific example is described below with respect to FIG. 3.

EXAMPLE

Substrate/Porous SiLK™/thin SiLK™ layer/HOSP BESt™/thin SiLK™ layer/Porous SiLK™

Figure 3:
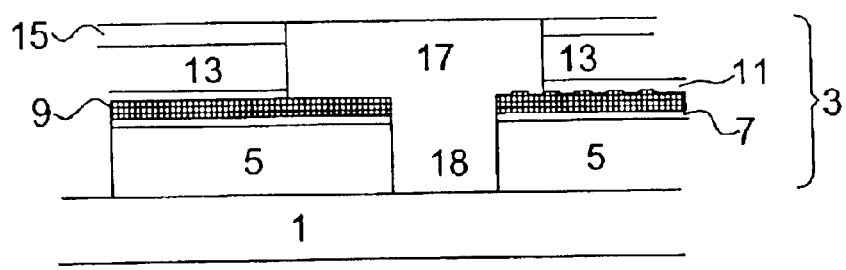
FIG. 3 is a schematic drawing of a structure in accordance with the invention, after RIE and metallization.

FIG. 3 schematically illustrates a specific embodiment of the invention. A substrate 1 may contain transistors and an array of conductor elements. An interconnect structure 3, in accordance with the invention, is disposed on the substrate 1. Structure 3 is comprised of a first porous SiLK™ dielectric layer 5, having a thickness of 600–5000 Angstroms and having a highly aromatic structure which is thermally stable to approximately 425° C., with a glass transition temperature above approximately 450° C., and a low dielectric constant of approximately 2.2.

A thin non porous SiLK™ layer 7, having a fracture toughness greater than 0.30 MPa-m$^{1/2}$ and having a thickness of approximately 25–150 Angstroms, is disposed on the first porous SiLK layer 5. As noted above, layer 7 has increased fracture toughness compared to porous SiLK due to a decreased network density. This structure has the same reactive functionalities as the porous SiLK layer 5 and can crosslink with porous SiLK layer 5. Layer 7 is a highly aromatic structure which is thermally stable to approximately 425° C. with a glass transition temperature above approximately 430° C., and a low dielectric constant of approximately 2.65.

A HOSP BESt™ (a spin-on hybrid organic-inorganic low-k dielectric) etch stop layer 9 of thickness 200–600 Angstroms (more preferably 200–300 Angstroms), and having an atomic composition that gives etch selectivity of at least 10:1 to the porous dielectric is disposed on the thin SiLK™ layer 7. The material of layer 9 has good adhesion to SiLK™, thermal stability to approximately 450° C., and a low dielectric constant of approximately 2.7.

A thin non-porous SiLK layer 11, having a fracture toughness greater than 0.30 MPa-m$^{1/2}$ and having a thickness of approximately 25–150 Angstrom, is disposed on the etch stop layer 9. Layer 11 has increased fracture toughness compared to porous SiLK™ due to a decreased network density. Layer 11 has the same reactive functionalities as a porous SiLK™ layer and can crosslink with a porous SiLK™ layer. Layer 11 has a highly aromatic structure which is thermally stable to approximately 425° C. with a glass transition temperature above approximately 430° C., and a low dielectric constant of approximately 2.65.

A second porous SiLK dielectric layer 13 having a thickness of approximately 600–5000 Angstroms, and having a highly aromatic structure which is thermally stable to approximately 425° C. with a glass transition temperature above approximately 450° C., and a low dielectric constant of approximately 2.2, is disposed on the thin SiLK™ layer 11.

Patterned metal lines 17 and vias 18, formed by a dual damascene process, such as that described in the above referenced U.S. Pat. No. 6,383,920, are formed within the dielectric multilayer of FIG. 3.

As is known by one skilled in the art, other low-k spin coated dielectric materials may be used for dielectric layers 5 and 13, for etch stop layer 9, and for the thin toughening layers 7 and 11.

A General Method for Fabricating the Structure of the Invention

Steps in the General Method

A. The stack of dielectric layers is applied

The inventive interconnect structure 3 is applied to the substrate 1 by spin on techniques. The first layer 5 in the structure is preferably a porous low k dielectric with a desired thickness of 600–5000 Å. This low k dielectric is applied by a spin-on technique with a spin speed of 1000–4000 rpm. After spinning the low k dielectric is hot plate baked to dry the solvent and render the film insoluble at 200–400° C. for 1–2 minutes. This time and temperature is sufficient to render the film insoluble without eliminating the porogen. After cooling a thin layer of a dielectric having a fracture toughness greater than 0.30 MPa-m$^{1/2}$ 7 capable of crosslinking with the bottom porous dielectric layer, and having a thickness of approximately 25–150 Angstroms is applied by spin coating. After spinning the dielectric is hot plate baked to dry the solvent and render the film insoluble at 200–400° C. for 1–2 minutes. After cooling, the buried RIE etch stop layer 9, with a desired thickness of approximately 200–600 Angstroms, is applied by a spin-on technique with a spin speed of 1000–4000 rpm. The etch stop layer is hot plate baked to dry the solvent and render the film insoluble at 200–400° C. for 1–2 minutes. This time promotes sufficient crosslinking to render the film insoluble. After cooling, a second thin layer of a dielectric having a fracture toughness greater than 0.30 MPa-m$^{1/2}$ 11 capable of crosslinking with the top porous dielectric layer, and having a thickness of 25–150 Angstroms is applied by spin coating. After spinning the low k dielectric is hot plate baked to dry the solvent and render the film insoluble at 200–400° C. for 1–2 minutes. After cooling, the top dielectric layer 13 is applied in a similar fashion. Layer 13 may be of the same composition as layer 5, but with a slightly higher thickness. The desired thickness of the top low k dielectric layer 13 is approximately 600–5000 Angstroms. This layer is spun at 1000–4000 rpm, then hot plate baked at approximately 100–400° C. for approximately 30–120 seconds to partially dry the solvent.

B. The stack of dielectric layers is cured in a single cure step

At this point the wafer is placed in a furnace in an atmosphere of pure $N_2$ (with very low $O_2$ and $H_2O$ concentrations) and cured at approximately 300–450° C. for approximately 15 minutes to 3 hours to crosslink the stack and burn out the sacrificial porogen.

C. Additional dielectric layers are added for dual damascene patterning (distributed hard mask)

For this step and the next, reference is made to the above mentioned U.S. Pat. No. 6,383,920.

D. The dual damascene structure of FIG. 3 is completed (using standard process steps)

A Method for Making the Preferred Embodiment)

(Porous SiLK™/Thin SiLK™ layer/HOSP BESt™/Thin SiLK™ layer/Porous SiLK™)

A. The stack of dielectric layers is applied

The first layer of low k dielectric porous SiLK™ is applied to the substrate by spin coating (layer 5, FIG. 3). After spinning, the wafer is placed on a 250° C. hot plate for 2 minute to partially dry the solvent. It is then transferred to a 310° C. hot plate for 2 minutes and a 400° C. hot plate for 2 minutes. This time and temperature are sufficient to render the film insoluble.

A solution of SiLK™, such as, for example, the composition specified in International Patent Application WO 00/40637 on page 17, Table II, resin I diluted to achieve a film thickness of about 100 Å at a spin speed of 3000 rpm, is applied to the wafer and spun at 3000 rpm for 30 seconds, to produce layer 7 (FIG. 3). After spinning, the wafer is placed on a hot plate at 310° C. for 1 minute to dry the solvent. It is then moved to a 400° C. hot plate for 2 minutes to partially crosslink the film. This time and temperature are sufficient to render the film insoluble.

A solution of HOSP BESt™ diluted to achieve a film thickness of 250 Angstroms at a spin speed of 3000 rpm, is applied to the wafer and spun at 3000 rpm for 30 seconds, to produce layer 9 (FIG. 3). After spinning, the wafer is placed on a hot plate at 310° C. for 2 minutes to dry and partially crosslink the film. This time and temperature is sufficient to render the film insoluble.

The solution of SiLK™ diluted to achieve a film thickness of 100 Angstroms, at a spin speed of 3000 rpm, is applied to the wafer and spun at 3000 rpm for 30 seconds to produce layer 11 (FIG. 3). After spinning, the wafer is placed on a hot plate at 310° C. for 1 minute to partially dry the solvent. It is then moved to a 400° C. hot plate for 2 minutes to partially crosslink the film. This time and temperature are sufficient to render the film insoluble. The wafer is then allowed to cool and is returned to the spinner.

The second layer of porous SiLK™ is applied in a manner similar to that for the first layer to produce layer 13 (FIG. 3). Porous SiLK™ is applied to the wafer and the wafer is spun at 3000 rpm for 30 seconds. The wafer is placed on a 250° C. hot plate for 2 minute to partially dry the solvent.

At this point the wafer is placed in an oxygen controlled oven and cured at 430° C. for 80 minutes to cure the SiLK and etch stop layers, to promote crosslinking between the layers, and to thermally degrade and burn out the porogen.

C. Additional dielectric layers are added for dual damascene patterning (distributed hard mask)

The cured wafer containing the layers described above was placed in a PE CVD reactor and a 350 Angstrom layer of silicon nitride 15 was deposited at 350° C., and then a 1500 Angstrom layer of SiO$_2$ was deposited at 350° C. This completes the formation of the dielectric multilayer of Example 1.

D. The dual damascene structure of FIG. 3 is completed

Lithography and etching processes are then performed as described in the above referenced U.S. Pat. No. 6,383,920. The dual damascene structure is then completed using standard process methods known in the industry (the etched trench and via opening are filled with a liner and then with copper, and the copper is planarized by CMP).

During the final CMP process, silicon dioxide layer deposited in step C. is removed, leaving the structure shown in FIG. 3. It should be noted that all the dielectric layers (5, 7, 9, 11 and 13) shown in FIG. 3 have been cured in a single furnace cure step after sequential application of the 5 layers in a single spin/apply tool.

Thus, The structure of the invention has improved adhesion over conventional buried etch stop structures because the non-porous layer will increase the surface area of contact with the etch stop layer by eliminating pores at the surface, and form covalent bonds with the porous dielectric to create one network.

Increased toughness is achieved by incorporating a tough material near the interface in the area of increased stress in the dielectric stack. This type of tough material may not have the necessary properties to support very small pores required by the porous dielectric and therefore cannot be used as the matrix for the porous dielectric.

Incorporating a non-porous dielectric layer between the etch stop and the porous dielectric layer allows for smoother lines by eliminating pores at the bottom of the etch stop. Specifically, in a dual damascene process, the last step of the RIE process that includes the cap open step, may result in the line bottoms etching through the etch stop and landing on the top of the dielectric that is directly below the etch stop. Incorporation of the thin dense dielectric between the via level porous dielectric and the etch stop will result in decreased line roughness compared with the conventional structure that has the porous dielectric directly below the etch stop.

While we have shown and described several embodiments in accordance with our invention, it is to be clearly understood that the same are susceptible to numerous changes apparent to one skilled in the art. Therefore, we do not wish to be limited to the details shown and described but intend to show all changes and modifications which come within the scope of the appended claims.

What is claimed is:

1. A structure comprising:

a substrate;

a plurality of porous dielectric layers disposed on said substrate;

an etch stop layer disposed between a first of said dielectric layers and a second of said dielectric layers; and at least one thin, non-porous dielectric layer disposed between at least one of said porous dielectric layers and said etch stop layer.

2. The structure of claim 1, wherein a thin, non-porous dielectric layer is disposed between only one of said porous dielectric layers and said etch stop layer.

3. The structure of claim 1, wherein a thin, non-porous dielectric layer is disposed between each of two of said porous dielectric layers and said etch stop layer.

4. The structure of claim 1, wherein a thin, non-porous dielectric layer is disposed above one of said porous dielectric layers and below said etch stop layer.

5. The structure of claim 1, wherein a thin, non-porous dielectric layer is disposed below one of said porous dielectric layers and above said etch stop layer.

6. The structure of claim 1, wherein said thin, non-porous dielectric layer has a thickness of substantially 25 to 150 Angstroms.

7. The structure of claim 1, wherein said thin, non-porous dielectric layer has a composition with reactive functionalities identical to those of said porous dielectric layers.

8. The structure of claim 1, wherein said thin, non-porous dielectric layer has a composition which forms a covalent bond with the composition of said porous dielectric layers.

9. The structure of claim 1, wherein said thin, non-porous dielectric layer is comprised of a material selected from low k dielectric materials that exhibit fracture toughness values greater than 0.30 MPa-m1/2 and will covalently bond to the porous dielectric layer.

10. The structure of claim 1, wherein at least one of said porous dielectric layers is comprised of a material selected from porous low k dielectric materials.

11. The structure of claim 1, wherein at least one of said porous dielectric layers has a thickness of substantially 600–5000 Angstroms.

12. The structure of claim 1, wherein said at least one of said porous dielectric layers has the same chemical composition as another of said porous dielectric layers.

13. The structure of claim 1, wherein said at least one of said porous dielectric layers has substantially the same thickness as another of said porous dielectric layers.

14. The structure of claim 1, wherein said etch stop layer has a chemical composition comprising silicon, carbon, oxygen, and hydrogen.

15. The structure of claim 1, wherein said etch stop layer is selected from the group consisting of organo silsesquioxanes, hydrido silsesquioxanes, hydrido-organo silsesquioxanes, siloxanes, and other spin-on material with etch selectivity to the porous dielectric.

16. The structure of claim 1, wherein said etch stop layer has a thickness of substantially 200–600 Angstroms.

17. The structure of claim 1, further comprising a plurality of patterned metal conductors formed within a multilayer stack of porous dielectric layers on the substrate, said stack including said plurality of porous dielectric layers.

18. The structure of claim 17, wherein at least one of the patterned metal conductors is an electrical via.

19. The structure of claim 17, wherein at least one of the patterned metal conductors is a line connected to said via.

20. The structure of claim 17, wherein the first porous dielectric layer has a metal via formed therein.

21. The structure of claim 17, wherein the second porous dielectric layer has a metal line formed therein.

22. A method for forming an electrical interconnect structure on a substrate, the structure having a plurality of porous dielectric layers disposed on said substrate and an etch stop layer between a first of said dielectric layers and a second of said dielectric layers comprising:

forming at least one thin, non-porous dielectric layer between at least one of said porous dielectric layers and said etch stop layer.

23. The method of claim 22, wherein a thin, non-porous dielectric layer is formed between only one of said porous dielectric layers and said etch stop layer.

24. The method of claim 22, wherein a thin, non-porous dielectric layer is formed between each of two of said porous dielectric layers and said etch stop layer.

25. The method of claim 22, wherein a thin, non-porous dielectric layer is formed above one of said porous dielectric layers and below said etch stop layer.

26. The method of claim 23, wherein a thin, non-porous dielectric layer is formed below one of said porous dielectric layers and above said etch stop layer.

27. The method of claim 22, wherein said thin, non-porous dielectric layer is formed to a thickness of substantially 25 to 150 Angstroms.

28. The method structure of claim 22, wherein said thin, non-porous dielectric layer is formed to have a composition with reactive functionalities identical to those of said porous dielectric layers.

29. The method of claim 22, wherein said thin, non-porous dielectric layer is formed to have a composition which forms a covalent bond with the composition of said porous dielectric layers.

30. The method of claim 22, wherein said thin, non-porous dielectric layer is comprised of a material selected from low k dielectric materials that exhibit fracture toughness values greater than 0.3 MPa-m$^{1/2}$ and covalently bond to the porous dielectric layer.

31. The structure of claim 22, wherein at least one of said porous dielectric layers is comprised of a material selected from porous low k dielectric materials.

32. The method of claim 22, wherein at least one of said porous dielectric layers is formed to have a thickness of substantially 600–5000 Angstroms.

33. The method of claim 22, wherein at least one of said porous dielectric layers is formed with the same chemical composition as another of said porous dielectric layers.

34. The method of claim 22, wherein at least one of said porous dielectric layers is formed to be of substantially the same thickness as another of said porous dielectric layers.

35. The method of claim 22, wherein said etch stop layer is selected from the group consisting of organo silsesquioxanes, hydrido silsesquioxanes, hydrido-organo silsesquioxanes, siloxanes, and other spin-on material with etch selectivity to the porous dielectric.

36. The method of claim 22, wherein said etch stop layer has a chemical composition comprising silicon, oxygen, carbon, and hydrogen.

37. The method of claim 22, wherein said etch stop layer is formed to have a thickness of substantially 200–600 Angstroms.

38. The method of claim 22, further comprising forming a multilayer stack of porous dielectric layers on the substrate, said stack including said plurality of porous dielectric layers, and forming a plurality of patterned metal conductors within said multilayer stack.

39. The method of claim 38, wherein at least one of the patterned metal conductors is formed as an electrical via.

40. The method of claim 38, wherein at least one of the patterned metal conductors is a line connected to said via.

41. The method of claim 38, wherein the first porous dielectric layer has a metal via formed therein.

42. The method of claim 38, wherein the second porous dielectric layer has a metal line formed therein.

43. The method of claim 38, wherein said multilayer dielectric stack is applied to said substrate by spin coating.

44. The method of claim 38, further comprising baking each layer of multilayer dielectric stack.

45. The method of claim 44, wherein said baking is accomplished on a hot plate.

46. The method of claim 38, further comprising curing said multilayer dielectric stack in a single cure step.

47. The method of claim 38, wherein said curing of the multilayer stack is a furnace curing process that is carried out at a temperature from about 300° C. to about 450° C. for a time period of from about 15 minutes to about 3 hours.

48. The method of claim 47, wherein said curing step crosslinks the films and burns out sacrifical porogen from the porous dielectric layers.

49. The method of claim 22, further comprising applying a miltilayer dielectric stack to said substrate and baking said multilayer dielectric stack, said applying and baking being accomplished in a single spin-coat tool.

50. The method of claim 22, further comprising adding additional dielectric layers, and forming dual damascene conductors in said additional layers.

51. The method of claim 22, wherein said substrate is a dielectric, a metal region, an adhesion promoter, a semiconductor wafer or any combination thereof.

* * * * *